(12) United States Patent
Uchida (10) Patent No.: US 10,012,968 B2
(45) Date of Patent: Jul. 3, 2018

(54) SERVER DEVICE, SERVER CONTROL METHOD, AND PROGRAM

(71) Applicant: NEC Corporation, Tokyo (JP)

(72) Inventor: Kazuya Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/463,423

(22) Filed: Mar. 20, 2017

(65) Prior Publication Data

US 2017/0277146 A1    Sep. 28, 2017

(30) Foreign Application Priority Data

Mar. 23, 2016  (JP) ................................. 2016-058318

(51) Int. Cl.
 *G06F 1/20* (2006.01)
 *G05B 15/02* (2006.01)
 *H05K 7/20* (2006.01)

(52) U.S. Cl.
 CPC .............. *G05B 15/02* (2013.01); *G06F 1/20* (2013.01); *H05K 7/20736* (2013.01); *H05K 7/20836* (2013.01)

(58) Field of Classification Search
 USPC .................................................... 361/679.48
 See application file for complete search history.

(56) References Cited

U.S. PATENT DOCUMENTS

| | | | | |
|---|---|---|---|---|
| 2006/0047808 A1* | 3/2006 | Sharma | ................... | G06F 9/505 709/224 |
| 2012/0041600 A1* | 2/2012 | Michael | ............. | G05D 23/1932 700/276 |
| 2012/0310439 A1* | 12/2012 | Lin | ..................... | G05D 23/1934 700/300 |
| 2013/0130609 A1* | 5/2013 | Chen | ................... | H05K 7/20745 454/184 |
| 2015/0227398 A1* | 8/2015 | Neumann | ............. | G06F 9/5027 718/103 |
| 2017/0277236 A1* | 9/2017 | Yokoyama | .............. | G06F 1/206 |

FOREIGN PATENT DOCUMENTS

| | | |
|---|---|---|
| JP | 2009-193247 A | 8/2009 |
| JP | 2011-082799 A | 4/2011 |
| JP | 2013-029915 A | 2/2013 |
| JP | 2014-183061 A | 9/2014 |
| JP | 2014-203321 A | 10/2014 |
| JP | 2015-088672 A | 5/2015 |
| JP | 2015-212888 A | 11/2015 |

OTHER PUBLICATIONS

Japanese Office Action corresponding to Japanese Application No. 2016-058318 dated Feb. 21, 2017, (11 pages).
Japanese Office Action issued by the Japan Patent Office for Japanese Application No. 2016-058318 dated Aug. 1, 2017 (6 pages).

* cited by examiner

*Primary Examiner* — Rodney Fuller
(74) *Attorney, Agent, or Firm* — Wilmer Cutler Pickering Hale and Dorr LLP (57) ABSTRACT

A server device having a plurality of server modules and a plurality of cooling fans in a chassis includes: a control unit configured to control the server modules and the cooling fans, which can be placed in predetermined positions. The control unit is configured to decide a server module and a cooling fan to become targets of operation status control from among the server modules and the cooling fans, on a basis of location information showing locations of the server modules and the cooling fans.

9 Claims, 6 Drawing Sheets

| | FAN | SERVER MODULE | | | SWITCH MODULE | POWER SUPPLY DEVICE |
|---|---|---|---|---|---|---|
| 1 | 3-1 3-2 | 2-3 | 2-2 | 2-1 | 41-1 | – |
| | | 2-6 | 2-5 | 2-4 | | |
| 2 | 3-3 3-4 | 2-9 | 2-8 | 2-7 | | – |
| | | 2-12 | 2-11 | 2-10 | | |
| 3 | 3-5 3-6 | 2-14 | 2-13 | – | 41-2 | – |
| | | 2-16 | 2-15 | – | | |
| 4 | 3-7 3-8 | 2-18 | 2-17 | – | | ○ |
| | | 2-20 | 2-19 | – | | |

SERVER DEVICE, SERVER CONTROL METHOD, AND PROGRAM

INCORPORATION BY REFERENCE

This application is based upon and claims the benefit of priority from Japanese patent application No. 2016-058318, filed on Mar. 23, 2016, the disclosure of which is incorporated herein in its entirety by reference.

TECHNICAL FIELD

The present invention relates to a server device, a server control method, and a program. More specifically, the present invention relates to a server device, a server control method and a program which reduce power consumption.

BACKGROUND ART

A server device is known which stores a plurality of server modules in a chassis and controls temperature in the chassis with a built-in fan (cooling fan). For such a server device, various techniques for efficiently cooling with less power are devised.

For example, Patent Document 1 discloses an enclosure control device which has a power supply control part, a cooling fan control part, and a blade unit control part. According to Patent Document 1, the blade unit control part decides a blade server to be the target of power supply control so that power supplied to a cooling fan becomes the least. To be specific, assuming each blade server is powered on, the blade unit control part calculates power supplied to a cooling fan unit. Then, on the basis of the calculation result, the blade unit control part decides a blade server to power on so that power supplied to the cooling fan unit becomes the least. According to Patent Document 1, such a configuration allows a cooling fan for cooling the blade server to efficiently run.

Patent Document 1: Japanese Unexamined Patent Application Publication No. JP-A 2013-029915

In the case of the technique disclosed by Patent Document 1, power supplied to a cooling fan is calculated, and a blade server to start is decided on the basis of the calculation result. Therefore, calculation of power supplied to a cooling fan in the case of starting each blade server is necessary for decision of a blade server to start. That is to say, in the case of technique disclosed by Patent Document 1, a complicated process of calculating power plural times and comparing the calculated results is required to decide a blade server to start.

Thus, for efficient cooling, it has been required to previously execute a complicated process. In other words, there has been a problem that, in a server device, it is difficult to promote the efficiency of cooling of the inside of a chassis and reduce power consumption of the device by a simple method.

SUMMARY OF THE INVENTION

Accordingly, an object of the present invention is to provide a server device which solves the problem that, in a server device which has a plurality of server modules, it is difficult to promote the efficiency of cooling of the inside of a chassis and reduce power consumption of the device by a simple method.

In order to achieve the object, a server device as an aspect of the present invention is a server device having a plurality of server modules and a plurality of cooling fans in a chassis.

The server device includes a control unit configured to control the server modules and the cooling fans, which can be placed in predetermined positions.

The control unit is configured to decide a server module and a cooling fan to become targets of operation status control from among the server modules and the cooling fans, on a basis of location information showing locations of the server modules and the cooling fans.

Further, a server control method as another aspect of the present invention is a server control method executed by a server device having a plurality of server modules and a plurality of cooling fans in a chassis.

The server control method includes executing control of the server modules and the cooling fans, which can be placed in predetermined positions.

In the control, location information showing locations of the server modules and the cooling fans is referred to, and a server module and a cooling fan to become targets of operation status control are decided from among the server modules and the cooling fans, on a basis of the location information having been referred to.

Further, a program as another aspect of the present invention is a program including instructions for causing a server device having a plurality of server modules and a plurality of cooling fans in a chassis, to realize a control unit configured to control the server modules and the cooling fans, which can be placed in predetermined positions.

The control unit is configured to decide a server module and a cooling fan to become targets of operation status control from among the server modules and the cooling fans, on a basis of location information showing locations of the server modules and the cooling fans.

With the configurations as described above, the present invention can provide a server device which solves the problem that, in a server device which has a plurality of server modules, it is difficult to promote the efficiency of cooling of the inside of a chassis and reduce power consumption of the device by a simple method.

EXEMPLARY EMBODIMENT

Figure 1:
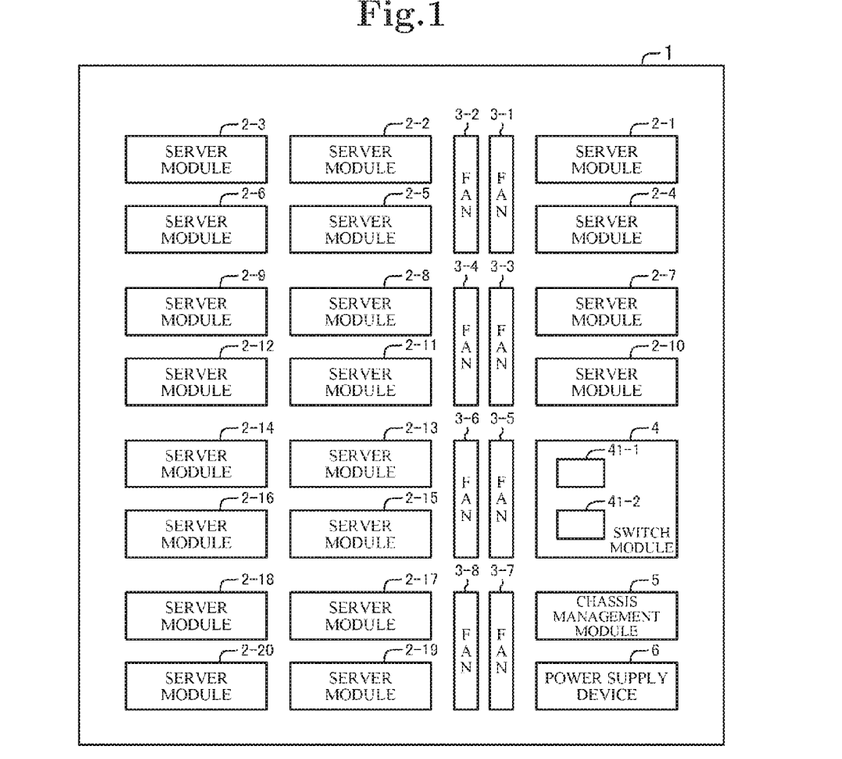
FIG. 1 is a block diagram showing an example of the configuration of a server device according to a first exemplary embodiment of the present invention.
Figure 2:
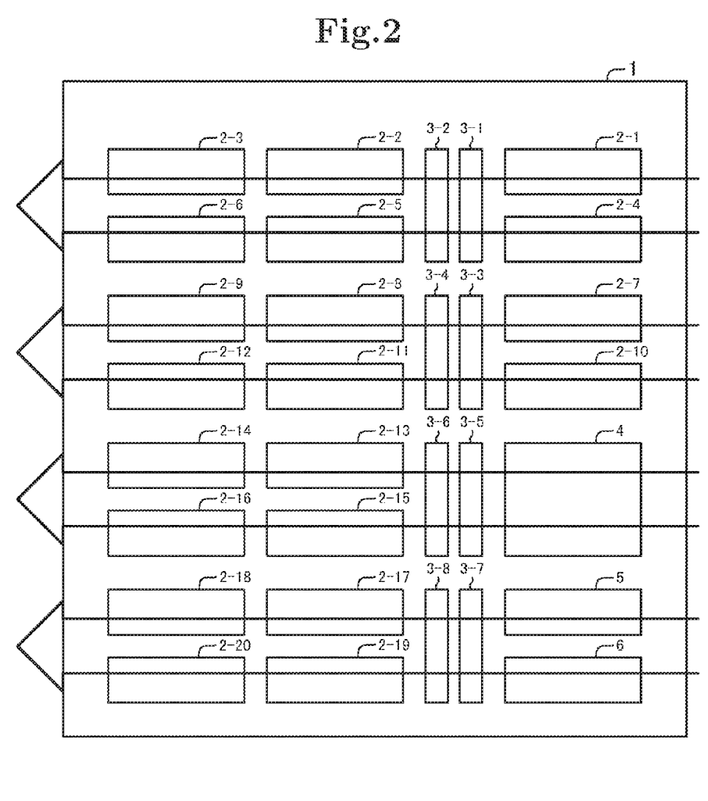
FIG. 2 is a diagram showing an example of airflows caused by fans shown in FIG. 1.
Figure 3:
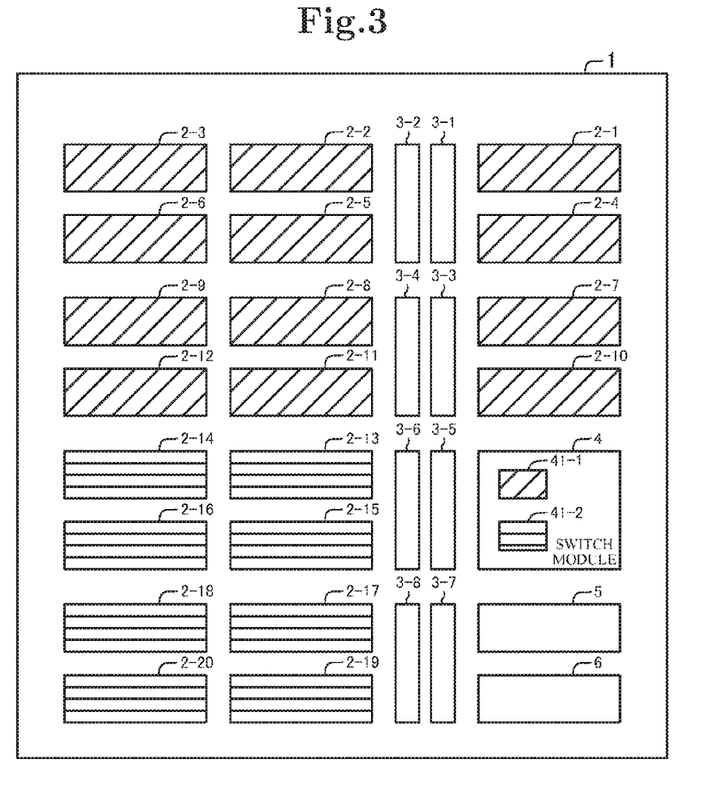
FIG. 3 is a diagram showing an example of the connection relation between server modules and a switch module shown in FIG. 1.
Figure 4:
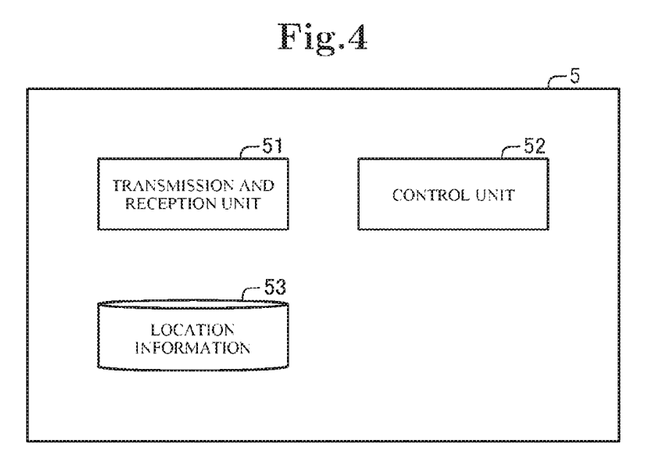
FIG. 4 is a block diagram showing an example of the configuration of a chassis management module shown in FIG. 1.
Figure 5:
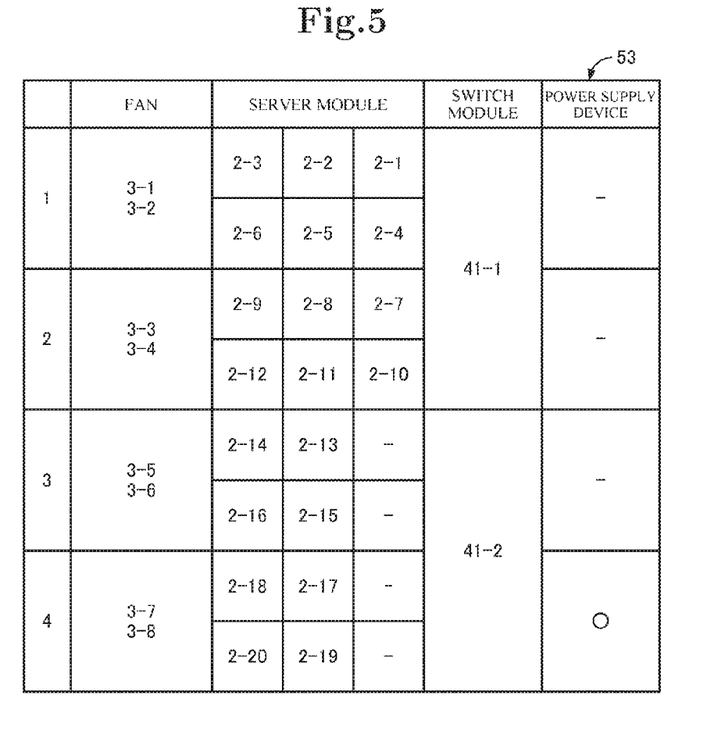
FIG. 5 is a diagram showing an example of location information shown in FIG. 4.
Figure 6:
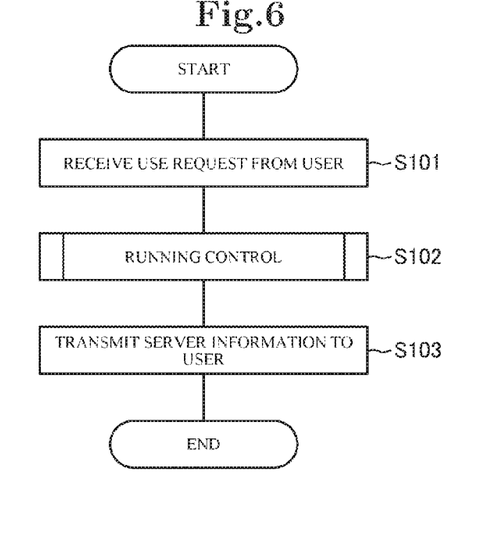
FIG. 6 is a flowchart showing an example of the operation of the server device according to the first exemplary embodiment of the present invention.
Figure 7:
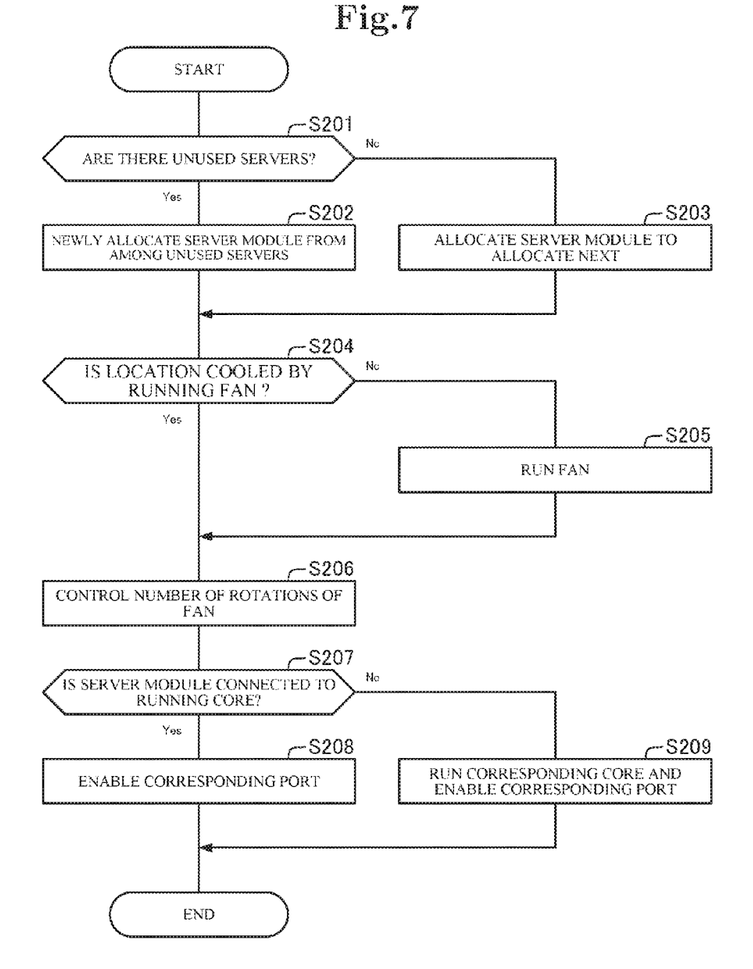
FIG. 7 is a flowchart showing an example of the flow of running control executed by the server device according to the first exemplary embodiment of the present invention.

A first exemplary embodiment of the present invention will be described with reference to FIGS. 1 to 7. FIG. 1 is a block diagram showing an example of the configuration of a server device 1. FIG. 2 is a diagram showing an example of airflows caused by fans 3. FIG. 3 is a diagram showing an example of the connection relation between server modules 2 and a switch module 4. FIG. 4 is a block diagram showing an example of the configuration of a chassis management module 5. FIG. 5 is a diagram showing an example of location information 53. FIGS. 6 and 7 are flowcharts showing an example of the operation of the server device 1.

In the first exemplary embodiment of the present invention, the server device 1 having a plurality of server modules 2 and a plurality of fans 3 (cooling fans) in a chassis will be described. The server modules 2 and the fans 3 in this exemplary embodiment can be placed in predetermined positions of the server device 1. As described later, the chassis management module 5 controlling the server modules 2 and the fans 3 decides the server module 2 to run and the fan 3 to run on the basis of the location (location information 53 showing the location) of the server modules 2 and the fans 3.

The server device 1 is a server device such as a micro modular server. Referring to FIG. 1, the server device 1 has a plurality of server modules 2 (2-1, 2-2 . . . , 2-20; expressed as the server module 2 when it is not distinguished from the others specifically). The server device 1 also has a plurality of fans 3 (3-1, 3-2 . . . , 3-8; expressed as the fan 3 when it is not distinguished from the others specifically).

Further, the server device 1 has the switch module 4, the chassis management module 5 (a control unit), and a power supply device 6.

As described before, the server device 1 in this exemplary embodiment allows placement of the server modules 2 and the fans 3 in predetermined positions. For example, in the server device 1, the server modules 2 and the fans 3 are tightly and regularly placed in the server device 1.

To be specific, for example, referring to FIG. 1, the server device 1 includes: the fans 3 arranged in four rows and two columns; and the server modules 2 placed in one column on one side from the fans 3 (for example, on a side where the power supply device 6 is provided) and in two columns on the other side. In other words, the fans 3 are arranged so as to be sandwiched by the server modules 2. For example, in the case of FIG. 1, a server module 2-3, a server module 2-2, a fan 3-2, a fan 3-1, and a server module 2-1 are placed in this order from the left side to the right side of FIG. 1.

Further, in the server device 1, the server modules 2 of two columns are placed for one fan 3 (the fan of one column). For example, in the case of FIG. 1, the server modules 2-3 to 2-1 are placed in the abovementioned order, and also, the server module 2-6, the server module 2-5, the fan 3-2, the fan 3-1 and the server module 2-4 are placed from the left side to the right in FIG. 1. That is to say, the server modules 2-1 and 2-4 in one column are placed on one side from the fans 3-2 and 3-1, whereas the server modules 2 in two columns, namely, the server modules 2-3 and 2-6 in one column and the server modules 2-2 and 2-5 in one column are placed on the other side.

Also with respect to the fans 3-4 and 3-3, the server modules 2 are placed as with respect to the fans 3-2 and 3-1. That is to say, in order from the left side in FIG. 1, the server module 2-9, the server module 2-8, the fan 3-4, the fan 3-3 and the server module 2-7 are placed. Likewise, the server module 2-12, the server module 2-11, the fan 3-4, the fan 3-3 and the server module 2-10 are placed.

Further, with respect to the fans 3-6 and 3-5, the switch module 4 is placed on one side, and the server modules 2 are placed on the other side (on a side where the server modules 2 of two rows are placed). For example, in the case of FIG. 1, in order from the left side in FIG. 1, the server module 2-14, the server module 2-13, the fan 3-6, the fan 3-5 and the switch module 4 are placed. Likewise, the server module 2-16, the server module 2-15, the fan 3-6, the fan 3-5 and the switch module 4 are placed.

Further, with respect to the fans 3-8 and 3-7, the chassis management module 5 and the power supply device 6 are placed on one side, and the server modules 2 are placed on the other side (on a side where the server modules 2 of two rows are placed). For example, in the case of FIG. 1, in order from the left side in FIG. 1, the server module 2-18, the server module 2-17, the fan 3-8, the fan 3-7 and the chassis management module 5 are placed. Moreover, the server module 2-20, the server module 2-19, the fan 3-8, the fan 3-7 and the power supply device 6 are placed.

In the server device 1, for example, the server modules 2, the fans 3, the switch module 4, the chassis management module 5 and the power supply device 6 are placed in the location as described above. Herein, when the location of the server modules 2 is seen along the column, for example, the server module 2-3, the server module 2-6, the server module 2-9, the server module 2-12, the server module 2-14, the server module 2-16, the server module 2-18 and the server module 2-20 are placed in this order. Therefore, when seen along the column, the server modules 2-1 to 2-3 and the fans 3-1 to 3-2 are positioned on the opposite side to a side where the power supply device 6 and the fans 3-7 to 3-8 are positioned in the server device 1.

Further, the respective components are placed in the location relation as described above, and the server modules 2 form paths which the wind passes through in the horizontal direction in FIG. 1. Therefore, airflows caused by the rotating fans 3 pass as shown in FIG. 2. Referring to FIG. 2, the server modules 2-1 to 2-6 are positioned on airflows caused by rotation of the fans 3-2 and 3-1. The server device 1 in this exemplary embodiment executes temperature control (for example, cooling) on the server modules 2 by using the airflows caused by the rotating fans 3. Therefore, the abovementioned location relation represents that the server modules 2-1 to 2-6 are placed in positions where they can be cooled by the running fans 3-2 and 3-1.

Further, referring to FIG. 2, the server modules 2-7 to 2-12 are positioned on airflows caused by rotation of the fans 3-4 and 3-3. Moreover, the server modules 2-13 to 2-16 and the switch module 4 are positioned on airflows caused by rotation of the fans 3-6 and 3-5. Moreover, the server modules 2-17 to 2-20, the chassis management module 5 and the power supply device 6 are positioned on airflows caused by rotation of the fans 3-8 and 3-7. The direction of the wind caused by the fans 3 may be a direction from the server module 2-1 to the server module 2-3 as shown in FIG. 2, or may be a direction from the server module 2-3 to the server module 2-1.

The switch module 4 is connected to each of the server modules 2 on the basis of the location of the server module 2. For example, the switch module 4 is connected to the server module 2 via a port determined by the location of the server module 2.

To be specific, the switch module 4 has cores 41 (a core 41-1 and a core 41-2) controlling ports, and is connected to the server modules 2 so that the server modules 2 placed within the same range are connected to ports under the control of the same core 41. For example, the switch module 4 is connected to the respective server modules 2 so that the server modules 2 placed in positions where they can be cooled by one fan 3 are connected to ports under the control of the same core 41.

For example, FIG. 3 shows the connection relation between the server modules 2 and the switch module 4, and shows that the server modules 2 and the cores 41 of the switch module 4 which are in the same pattern are connected. Referring to FIG. 3, the server modules 2-1 to 2-12 are connected to ports under the control of the core 41-1 of the switch module 4. Moreover, the server modules 2-13 to 2-20 are connected to ports under the control of the core 41-2 of the switch module 4.

That is to say, the server modules 2-1 to 2-6 placed in positions where they can be cooled by the fans 3-1 and 3-2 are connected to the ports under the control of the core 41-1. Moreover, the server modules 2-7 to 2-12 placed in positions where they can be cooled by the fans 3-3 and 3-4 are connected to the ports under the control of the core 41-1. On the other hand, the server modules 2-13 to 2-16 placed in positions where they can be cooled by the fans 3-5 and 3-6 are connected to the ports under the control of the core 41-2. Moreover, the server modules 2-17 to 2-20 placed in positions where they can be cooled by the fans 3-7 and 3-8 are connected to the ports under the control of the core 41-2. Thus, the server modules 2 are connected to the switch module 4 in accordance with the positions of the server modules 2.

The chassis management module 5 (CMM: Chassis Management Module) receives a use request for the server module 2 from the user. Then, in response to the received use request, the chassis management module 5 decides the server module 2 to run, and runs the decided server module 2. Moreover, the chassis management module 5 runs the fan 3 as needed. After that, the chassis management module 5 transmits information for accessing the server module 2 run thereby (for example, the MAC address (Media Access Control address) of a BMC (Baseboard Management Controller) installed in the server module 2) to the user.

Referring to FIG. 4, the chassis management module 5 has a transmission and reception unit 51, a control unit 52, and location information 53. The chassis management module 5 has an arithmetic device and a storage device, which are not shown in the drawings, and the respective units are realized by execution of a program stored in the storage device by the arithmetic device. Moreover, the location information 53 is stored in a storage device such as a memory.

The transmission and reception unit 51 receives a use request for the server module 2 from the user via the switch module 4, for example. Moreover, the transmission and reception unit 51 transmits information for accessing the server module 2 run by the control unit 52 to the user.

The control unit 52 decides the server module 2 to run and the fan 3 to run on the basis of the location information 53, and controls the operation status of the decided server module 2 and fan 3. Moreover, the control unit 52 executes control of the number of rotations of the fan 3 and control of the operation status of the switch module 4 on the basis of the operation status of the server module 2.

For example, the control unit 52 decides on the fan 3 and the server module 2 placed in a position where it can be cooled by the fan 3 as the fan 3 to run and the server module 2 to run, on the basis of the location information 53. Then, the control unit 52 newly runs the fan 3 and server module 2 decided as the fan 3 and server module 2 to run. In a manner, for example, as described above, the control unit 52 controls the operation status of the server module 2 and the fan 3. Moreover, in a case where there is the running fan 3, the control unit 52 decides on the server module 2 positioned on the airflow caused by the fan 3 as the server module 2 to run on the basis of the location information 53, and controls the operation status (for example, newly runs).

To be specific, for example, assuming a case where there is no running server module 2, the running fans 3 of all the fans 3 are only the fans 3-7 and 3-8 running at all times to cool the power supply device 6, for example. Therefore, in such a case, the control unit 52 decides the server module 2 to run on the basis of the location information 53 so as to first run the server module 2 positioned on the airflows caused by the fans 3-7 and 3-8. In the case shown in FIG. 1, the server module 2 positioned on the airflows caused by the fans 3-7 and 3-8 are any of the server modules 2-17, 2-18, 2-19 and 2-20. Thus, the control unit 52 decides on any of the server modules 2-17, 2-18, 2-19 and 2-20 as the server module 2 to run. For example, the control unit 52 decides on the server module 2-20 as the server module 2 to run. Then, the control unit 52 runs the server module 2-20. Meanwhile, the control unit 52 may execute control so as to simultaneously run a plurality of server modules 2 as necessary.

Further, the control unit 52 determines on the basis of the location information whether or not the fan 3 capable of cooling the server module 2 to run is in the running state. That is to say, the control unit 52 determines on the basis of the location information 53 whether or not the server module 2 to run is positioned on an air flow caused by the running fan 3. In the abovementioned case, the fans 3-7 and 3-8, which are the fans 3 capable of cooling the server module 2-20, are in the running state. Therefore, the control unit 52 does not newly run the fans 3. Meanwhile, in a case where the fan 3 capable of cooling the server module 2 to run is not in the running state, the control unit 52 newly runs the fan 3 located in the corresponding position (a position where the server module 2 can be cooled).

As a result of the abovementioned process, the fans 3-7 to 3-8 and the server module 2-20 come to the running state. Thus, the control unit 52 decides the server module 2 to run and the fan 3 to run on the basis of the location information 53.

Next, for example, let us assume a case of, after running all the server modules 2 located in the positions where they can be cooled by the fans 3-7 and 3-8, newly receiving a use request from the user. In this case, on the basis of the location information 53, the control unit 52 decides on, and runs the fan 3 and the server module 2 positioned on the airflow caused by the fan 3 as the server module 2 to run and the fan 3 to run. For example, the control unit 52 decides on the server module 2-16 as the server module 2 to newly run. Thus, on the basis of the location information 53, the control unit 52 decides the server module 2 to run, for example, without space in order from the end of the chassis of the server device 1. Moreover, after newly running the server module 2-16, the control unit 52 newly runs the fans 3-5 and 3-6 located in the positions where they can cool the server module 2-16.

In a manner, for example, as described above, the control unit 52 decides the server module 2 to run without space in order from the end of the chassis of the server device 1 on the basis of the location information 53. This decreases the need to cool an area on the other side (the side of the server module 2-1 and so on).

Further, on the basis of the operation status of the server module 2 placed in a position where it can be cooled by each of the fans 3, the control unit 52 controls the number of rotations of the fan 3. To be specific, the control unit 52 controls the number of rotations of the fan 3 in accordance with the number of the running server modules of the server modules 2 located in the positions where they can be cooled and the temperature of the server modules 2. For example, the control unit 52 controls the number of rotations of the fan 3 so that the number of rotations of the fan 3 increases as the number of the running server modules 2 of the server modules 2 located on the airflow caused by rotation of the fan 3 increases. Also, for example, the control unit 52 controls the number of rotations of the fan 3 so that the number of rotations of the fan 3 increases as the temperature of the server module 2 located on the airflow caused by rotation of the fan 3 increases.

For example, assuming the server module 2-19 is caused to newly run under a condition that the fans 3-7 to 3-8 and the server module 2-20 are running, the number of the server modules 2 located on the airflows caused by the fans 3-7 to 3-8 increases from 1 to 2. Then, the control unit 52 controls the fans 3 to increase the number of rotations of the fans 3. Thus, the control unit 52 controls the number of rotations of the fans 3 in accordance with the number of the server modules 2 in the running state. Meanwhile, in a case where any server module 2 of the server modules 2 located in the positions where they can be cooled is not in the running state and the power supply device 6 is not placed in the position where it can be cooled, the control unit 52 executes control not to rotate the fans 3 (or control to rotate at very low speeds), for example. In a case as described above, the control unit 52 may execute control so that only one of the fans of two columns actively runs. That is to say, for example, the control unit 52 can execute control so that the fan 3-4 rotates independently and the fan 3-3 rotates with an airflow caused by rotation of the fan 3-4.

Further, the control unit 52 controls the operation status of the switch module 4 on the basis of the location of the server module 2 in the running state. For example, the control unit 52 controls the core 41 of the switch module 4 so that the port connected to the running server module 2 comes to the running state.

For example, let us assume a case where the fans 3-7 to 3-8 and the server modules 2-19 to 2-20 are in the running state. In this case, the control unit 52 runs the core 41-2, but does not run the core 41-1. Moreover, for example, in the case of running the server module 2-12, the control unit 52 runs the core 41-1. Thus, the control unit 52 controls the operation status of the switch module 4 on the basis of the location of the server module 2 in the running state.

The location information 53 shows the location of the server modules 2 and the fans 3 placed in the server device 1. Moreover, the location information 53 includes information showing the relation between airflows caused by operation of the fans 3 and the location of the server modules 2 (information for distinguishing the server module 2 positioned on the airflow caused by operation of the fan 3). As described above, the location information 53 is used by the control unit 52.

FIG. 5 shows an example of the location information 53. As shown in FIG. 5, the location information 53 includes information showing the location of the fans 3 and the server modules 2. For example, in the case shown in FIG. 5, the location of the respective components in the vertical direction in FIG. 1 is shown along the row. For example, the first row in FIG. 5 shows that the server module 2-1, the server module 2-2, the server module 2-3, the fan 3-1 and the fan 3-2 are associated. That is to say, it can be found from the first row in FIG. 5 that the server modules 2-1, 2-2 and 2-3 are placed on airflows caused by operation of the fans 3-1 and 3-2.

Further, as shown in FIG. 5, the location information 53 can include information showing the connection relation between the server modules 2 and the switch module 4. For example, on the first row in FIG. 5, the server modules 2-1, 2-2 and 2-3 are associated with the core 41-1 of the switch module 4. That is to say, it can be found from FIG. 5 that the server modules 2-1, 2-2 and 2-3 are connected to the core 41-1 of the switch module 4.

Further, the location information 53 can include information showing the location of the power supply device 6. For example, on the seventh row in FIG. 5, the fans 3-7 to 3-8, the server modules 2-17 to 2-18 and the switch module 41-2 are associated with information showing the location of the power supply device 6. That is to say, it can be found from FIG. 5 that the power supply device 6 is placed on an airflow caused by operation of the fans 3-7 and 3-8. Moreover, as described above, in the case shown in FIG. 5, the location of the respective components in the vertical direction of FIG. 1 are shown along the row. Therefore, referring to FIG. 5, it can be found that a side on which the fans 3-1 and 3-2 are positioned is opposite to a side on which the power supply device 6 is positioned.

As far as the location information 53 includes at least information showing the location of the server modules 2 and the fans 3 and information showing the relation between airflows caused by the fans 3 and the location of the server modules 2, information additionally included therein is not limited in particular. The location information 53 can include, for example, information showing whether or not each of the server modules 2 and the fans 3 is in the running state.

The power supply device 6 is connected to an external power supply, and is also connected to the server modules 2, the fans 3, the switch module 4, and the chassis management module 5. The power supply device 6 is supplied with power by the external power supply and supplies power to the server modules 2, the fans 3, the switch module 4, and the chassis management module 5.

An example of the configuration of the server device 1 has been described above.

Next, with reference to FIGS. 6 and 7, an example of the operation of the server device 1 will be described.

Referring to FIG. 6, the transmission and reception unit 51 of the chassis management module 5 receives a use request for the server module 2 from the user (step S101). Then, the transmission and reception unit 51 transmits reception of the use request to the control unit 52.

In response to the received use request, the control unit 52 decides the server module 2 to run and runs the decided server module 2. The control unit 52 also controls the fan 3 and the switch module 4 as needed. Thus, on the basis of the received use request, the control unit 52 executes running control of the server module 2 and so on (step S102).

After that, the chassis management module 5 transmits information for accessing the server module 2 caused to run to the user (step S103).

An example of the operation of the server device 1 has been described above. Next, an example of a detailed flow of the running control at step S102 will be described with reference to FIG. 7.

Referring to FIG. 7, the control unit 52 checks whether or not there are the server modules 2 having been unused (step S201).

In a case where there are the unused server modules 2 (step S201, Yes), the control unit 52, with reference to the location information 53, decides the server module 2 to newly run from among the unused server modules 2 and runs the decided server module 2. For example, in a case where there is the unused sever module 2 among the server modules 2 placed in the positions where they can be cooled by the running fan 3, the control unit 52 decides on the unused server module 2 as the server module 2 to run and runs the decided server module 2. Moreover, in a case where there is not the unused server module 2 among the server modules 2 placed in the positions where they can be cooled by the running fan 3, the control unit 52 decides the server module 2 to newly run without space in order from the end of a location information case (step S202). On the other hand, in a case where there is not the unused server module 2 (step S201, No), the control unit 52 selects the server module 2 to allocate next from among the running server modules 2, and allocates the selected server module 2 (step S203). That is to say, the control unit 52 selects the running server module 2 and allocates a new task to the selected server module 2.

Next, with reference to the location information 53, the control unit 52 checks whether or not the location of the server module 2 caused to run is on the airflow caused by rotation of the running fan 3 (step S204). In a case where the location of the server module 2 caused to run is not on the airflow caused by rotation of the running fan 3 (step S204, No), the control unit 52 runs the fan 3 corresponding to the location of the server module 2 caused to run (step S205). On the other hand, in a case where the location of the server module 2 caused to run is on the airflow caused by rotation of the running fan 3 (step S204, Yes), the control unit 52 does not execute control to newly run the fan 3.

Subsequently, the control unit 52 controls the number of rotations of the fan 3 in accordance with the operation status of the server module 2 placed in a position where it can be cooled (step S206). For example, the control unit 52 controls the number of rotations of the fan 3 so that the number of rotations of the fan 3 increases as the number of the server modules 2 in the running state of the server modules 2 placed on the airflow caused by rotation of the fan 3 increases. Moreover, for example, the control unit 52 controls the number of rotations of the fan 3 so that the number of rotations of the fan 3 increases as the temperature of the server module 2 placed on the airflow caused by rotation of the fan 3.

Further, the control unit 52 checks whether or not the server module 2 caused to run is connected to the port of the core 41 of the running switch module 4 (step S207). In a case where the server module 2 caused to run is connected to the port of the core 41 of the running switch module 4 (step S207, Yes), the control unit 52 instructs the core 41 of the switch module 4 to enable (run) the corresponding port. On the other hand, in a case where the server module 2 caused to run is not connected to the port of the core 41 of the running switch module 4 (step S207, No), the control unit 52 runs the corresponding core 41 and enables the corresponding port (step S209).

An example of a detailed flow of the running control at the step S102 has been described above.

Thus, the server device 1 in this exemplary embodiment has the chassis management module 5 which has the control unit 52 and the location information 53. Such a configuration allows the control unit 52 to, on the basis of the location information 53, decide the server module 2 to run and the fan 3 to run, and run the decided server module 2 and fan 3. That is to say, for example, on the basis of the location information 53, the control unit 52 can decide on the fan 3 and the server module 2 placed in a position where it can be cooled by operation of the fan 3 as the server module 2 to run and the fan 3 to run, and run the decided server module 2 and fan 3. Consequently, for example, the number of the fans 3 necessary for cooling can be reduced, and only the right number of fans 3 necessary for cooling can be run. As a result, it becomes possible to promote the efficiency of cooling of the inside of the chassis, and reduce power consumption of the server device 1.

Further, the server device 1 in this exemplary embodiment controls the number of rotations of the fan 3 in accordance with the operation status of the server modules 2, such as the number of the server modules 2 in the running state of the server modules located in the positions where they can be cooled. Consequently, it is possible to prevent, for example, the fan 3 to be rotated beyond an amount necessary for cooling. As a result, power consumption of the server device 1 can be reduced.

Further, the control unit 52 in this exemplary embodiment controls the operation status of the switch module 4 so that the port connected to the running server module 2 comes to the running state. That is to say, the control unit 52 execute control so that only the core 41 controlling the port connected to the running server module 2 comes to the running state. Consequently, the core 41 to run can be limited, and power consumption of the switch module 4 can be reduced.

Further, the control unit 52 in this exemplary embodiment decides the server module 2 to newly run, for example, without space in order from around the running fan 3 (around the power supply device 6) on the basis of the location information. By thus deciding the server module 2 to run, it is possible to decrease the need for cooling an area (on a side of the server module 2-1 and so on) on the opposite side to a side where the power supply device 6 is positioned. As a result, it becomes possible to execute necessary temperature control without the need for running the fan positioned on the opposite side to the side where the power supply device 6 is positioned.

The location of the server modules 2, the fans 3, the switch module 4, the chassis management module 5 and the power supply device 6 in the server device 1 described in this exemplary embodiment is an example. In the server device 1, the server modules 2, the fans 3, the switch module 4, the chassis management module 5 and the power supply device 6 may be placed in positions other than those described in this exemplary embodiment. Thus, the present invention can be applied without any problem to the server device 1 with an arrangement other than that shown in FIG. 1. Further, the numbers of the server modules 2, the fans 3, the switch module 4, the chassis management module 5 and the power supply device 6 are not limited to those described in this exemplary embodiment.

Further, the control unit 52 decides the server module 2 to newly run without space in order from the end of the chassis, in a case where the unused server module 2 is not present in the server modules placed in the positions where they can be cooled by the running fan 3. However, in control by the control unit 52, the server module 2 to newly run may be decided in a method other than the method described above.

For example, the control unit 52 can be configured to decide the server module 2 to run so that the number of rotations of the fan 3 and the temperature of the server module 2 become constant. To be specific, for example, the control unit 52 can, with reference to the location information 53, vary the server module 2 to run so that the server module 2 positioned on an airflow caused by the single fan 3 does not successively run. Moreover, the control unit 52 can, with reference to the location information 53, vary the server module 2 to run so that the server modules 2 adjacent to each other do not successively run. The control unit 52 may also be configured to decide the server module 2 to run by any of the abovementioned methods or in combination of the methods.

Further, the control unit 52 may, after running the server module 2 placed in a position where it can be cooled by the fans 3-7 and 3-8, decide the server module 2 to newly run from the side of the server module 2-1 placed in a position away from the power supply device 6. In general, the power supply device 6 is a large heat source. Therefore, by running the server module 2 placed in a position where it can be cooled by the fans 3-7 and 3-8 and thereafter deciding the server module 2 to newly run so as to avoid the power supply device 6 as described above, it is possible to prevent concentration of the devices as heat sources. Thus, the control unit 52 may be configured to decide the server module 2 to run in consideration of the location of the power supply device 6.

It is desirable that the server module 2 to be newly run by the control unit 52 responds to the connection relation between the switch module 4 and the server modules 2. The control unit 52 may be configured to, for example, refer to information showing the connection relation between the switch module 4 and the server modules 2 and decide the server module 2 to newly run on the basis of the information showing the connection relation.

Further, the connection relation between the server modules 2 and the switch module 4 is not limited to that described in this exemplary embodiment. The server modules 2 and the switch module 4 may be in a connection relation other than the connection relation described in this exemplary embodiment as far as they have a connection relation based on the location of the server modules 2.

Second Exemplary Embodiment

Next, with reference to FIG. 8, a second exemplary embodiment of the present invention will be described. In this exemplary embodiment, the overview of the configuration of a server device 7 having a plurality of server modules 71 and a plurality of cooling fans 72 in a chassis will be described.

Figure 8:
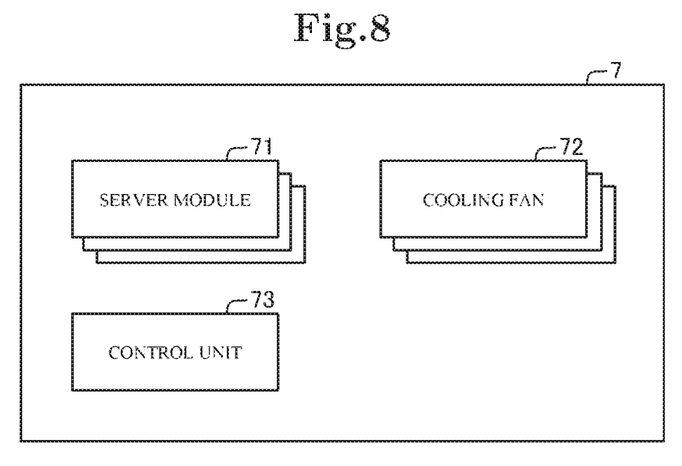
FIG. 8 is a schematic block diagram showing an example of the configuration of a server device according to a second exemplary embodiment of the present invention.

Referring to FIG. 8, the server device 7 has the plurality of server modules 71, the plurality of cooling fans 72, and a control unit 73. The server modules 71 and the cooling fans 72 can be placed in predetermined positions.

The control unit 73 controls the server modules 71 and the cooling fans 72. The control unit 73 has location information showing the location of the positions of the server modules 71 and the positions of the cooling fans 72, and decides the server module 71 to run and the cooling fan 72 to run on the basis of the location information.

Thus, the server device 7 in this exemplary embodiment has the control unit 73, and the control unit 73 has the location information showing the location of the positions of the server modules 71 and the positions of the cooling fans 72. Such a configuration allows the server device 7 to decide the server module 71 to run and the cooling fan 72 to run on the basis of the location information. As a result, the control unit 73 can decide on the cooling fan 72 and the server module 71 placed in a position where it can be cooled by operation of the cooling fan 72, as the server module 71 to run and the cooling fan 72 to run, for example, on the basis of the location information. Consequently, for example, it becomes possible to reduce the number of the fans 3 necessary for cooling, and it becomes also possible to run only a right number of fans 3 needed to cool. As a result, it becomes possible to promote the efficiency of cooling in the chassis and reduce power consumption of the server device 1.

The server device 7 can be realized by installation of a predetermined program into the server device 7. To be specific, a program as another aspect of the present invention is a program including instructions for causing a server device to realize a control unit. The server device has a plurality of server modules and a plurality of cooling fans in a chassis. The control unit controls the server modules and the cooling fans. The server modules and the cooling fans can be placed in predetermined positions. The control unit has location information showing the location of the server modules and the cooling fans. The program includes instructions for deciding a server module to run and a cooling fun to run on the basis of the location information.

Further, a server control method executed by operation of the server device 7 described above is a server control method executed by a server device having a plurality of server modules and a plurality of cooling fans in a chassis. The server modules and the cooling fans can be placed in predetermined positions. Location information showing the location of the server modules and the cooling fans is provided. The method includes referring to the location information and, on the basis of the location information having been referred to, deciding a server module to run and a cooling fan to run.

The inventions of the program and the server control method having the abovementioned configurations also have the same actions as the server device 7, and therefore, can achieve the abovementioned object of the present invention.

<Supplementary Notes>

The whole or part of the exemplary embodiments disclosed above can be described as the following supplementary notes. The overview of a server device and the like according to the present invention will be described below. However, the present invention is not limited to the following configurations.

(Supplementary Note 1)

A server device having a plurality of server modules and a plurality of cooling fans in a chassis, the server device comprising:

a control unit configured to control the server modules and the cooling fans, the server modules and the cooling fans being able to be placed in predetermined positions, wherein the control unit is configured to decide a server module and a cooling fan to become targets of operation status control from among the server modules and the cooling fans, on a basis of location information showing locations of the server modules and the cooling fans.

(Supplementary Note 2)

The server device according to Supplementary Note 1, wherein the control unit is configured to decide on a cooling fan and a server module placed in a position that can be cooled by the cooling fan, as the cooling fan and the server module to become the targets of the operation status control, on the basis of the location information.

(Supplementary Note 2-1)

The server device according to Supplementary Note 1 or 2, wherein the control unit is configured to decide on a cooling fan and a server module located on an airflow caused by the cooling fan, as a cooling fan to run and a server module to run, on the basis of the location information.

(Supplementary Note 3)

The server device according to Supplementary Note 1 or 2, wherein the control unit is configured to decide on, in a case where there is a cooling fan in a running state, a server module located on an airflow caused by the cooling fan as the server module to become the target of the operation status control.

(Supplementary Note 4)

The server device according to any of Supplementary Note 1 to 3, wherein the control unit is configured to control a number of rotations of a cooling fan in accordance with an operation status of a server module located in a position that can be cooled by the cooling fan.

(Supplementary Note 5)

The server device according to Supplementary Note 4, wherein the control unit is configured to control the number of rotations of the cooling fan in accordance with a number of server modules in a running state of server modules located in positions that can be cooled by the cooling fan.

(Supplementary Note 6)

The server device according to any of Supplementary Notes 1 to 5, comprising a switch module connected to each of the server modules and configured to relay communication to an outside of the chassis, wherein:

the server modules and the switch module are connected on the basis of the location information; and the control unit is configured to control an operation status of the switch module on a basis of a location of a server module in a running state.

(Supplementary Note 7)

The server device according to Supplementary Note 6, wherein:

the switch module is connected to each of the server modules through a port determined in accordance with the location information; and the control unit is configured to control the operation status of the switch module so that a port connected to the server module in the running state is brought to a running state.

(Supplementary Note 8)

The server device according to Supplementary Note 6 or 7, wherein the control unit is configured to newly decide the server module to become the target of the operation status control, on a basis of a connection relation between the server modules and the switch module.

(Supplementary Note 9)

A server control method executed by a server device having a plurality of server modules and a plurality of cooling fans in a chassis, the server control method comprising:

executing control of the server modules and the cooling fans, the server modules and the cooling fans being able to be placed in predetermined positions, wherein, in the control, location information showing locations of the server modules and the cooling fans is referred to, and a server module and a cooling fan to become targets of operation status control are decided from among the server modules and the cooling fans, on a basis of the location information having been referred to.

(Supplementary Note 9-1)

The server control method according to Supplementary Note 9, wherein the control unit is configured to decide on a cooling fan and a server module placed in a position that can be cooled by the cooling fan, as the cooling fan and the server module to become the targets of the operation status control, on the basis of the location information.

(Supplementary Note 9-2)

The server control method according to Supplementary Note 9 or 9-1, wherein the control unit is configured to decide on, in a case where there is a cooling fan in a running state, a server module located on an airflow caused by the cooling fan as the server module to become the target of the operation status control.

(Supplementary Note 10)

A program comprising instructions for causing a server device having a plurality of server modules and a plurality of cooling fans in a chassis, to realize a control unit configured to control the server modules and the cooling fans, the server modules and the cooling fans being able to be placed in predetermined positions, wherein the control unit is configured to decide a server module and a cooling fan to become targets of operation status control from among the server modules and the cooling fans, on a basis of location information showing locations of the server modules and the cooling fans.

(Supplementary Note 10-1)

The program according to Supplementary Note 10, wherein the control unit is configured to decide on a cooling fan and a server module placed in a position that can be cooled by the cooling fan, as the cooling fan and the server module to become the targets of the operation status control, on the basis of the location information.

(Supplementary Note 10-2)

The program according to Supplementary Note 10 or 10-1, wherein the control unit is configured to decide on, in a case where there is a cooling fan in a running state, a server module located on an airflow caused by the cooling fan as the server module to become the target of the operation status control.

(Supplementary Note 11)

A non-transitory computer-readable medium storing a program comprising instructions for causing a server device having a plurality of server modules and a plurality of cooling fans in a chassis, to realize a control unit configured to control the server modules and the cooling fans, the server modules and the cooling fans being able to be placed in predetermined positions, wherein the control unit is configured to decide a server module and a cooling fan to become targets of operation status control from among the server modules and the cooling fans, on a basis of location information showing locations of the server modules and the cooling fans.

(Supplementary Note 11-1)

The non-transitory computer-readable medium storing a program according to Supplementary Note 11, wherein the control unit is configured to decide on a cooling fan and a server module located on an airflow caused by the cooling fan, as a cooling fan to run and a server module to run, on the basis of the location information.

(Supplementary Note 11-2)

The non-transitory computer-readable medium storing a program according to Supplementary Note 11 or 11-1, wherein the control unit is configured to decide on, in a case where there is a cooling fan in a running state, a server module located on an airflow caused by the cooling fan as the server module to become the target of the operation status control.

The program described in the exemplary embodiments and supplementary notes is stored in a storage device or recorded on a computer-readable recording medium. For example, the recording medium is a portable medium such as a flexible disk, an optical disk, a magneto-optical disk, and a semiconductor memory.

Although the present invention is described above with reference to the exemplary embodiments, the present invention is not limited to the exemplary embodiments. The configurations and details of the present invention can be changed in various manners that can be understood by one skilled in the art within the scope of the present invention.

DESCRIPTION OF NUMERALS 1 server device
2 server module
3 fan
4 switch module
41 core
5 chassis management module
51 transmission and reception unit
52 control unit
52 location information
6 power supply device
7 server device
71 server module
72 cooling fan
73 control unit

The invention claimed is:

1. A server device having a plurality of server modules and a plurality of cooling fans in a chassis, the server device comprising:
   a control unit configured to control the server modules and the cooling fans, the server modules and the cooling fans being able to be placed in predetermined positions, wherein:
   the control unit is configured to decide a server module and a cooling fan to become targets of operation status control from among the server modules and the cooling fans, on a basis of location information showing locations of the server modules and the cooling fans; and
   the control unit is configured to decide on, in a case where there is a cooling fan in a running state, a server module located on an airflow caused by the cooling fan as the server module to become the target of the operation status control.

2. The server device according to claim 1, wherein the control unit is configured to decide on a cooling fan and a server module placed in a position that can be cooled by the cooling fan, as the cooling fan and the server module to become the targets of the operation status control, on the basis of the location information.

3. The server device according to claim 1, wherein the control unit is configured to control a number of rotations of a cooling fan in accordance with an operation status of a server module located in a position that can be cooled by the cooling fan.

4. The server device according to claim 3, wherein the control unit is configured to control the number of rotations of the cooling fan in accordance with a number of server modules in a running state of server modules located in positions that can be cooled by the cooling fan.

5. The server device according to claim 1, comprising a switch module connected to each of the server modules and configured to relay communication to an outside of the chassis, wherein:
   the server modules and the switch module are connected on the basis of the location information; and
   the control unit is configured to control an operation status of the switch module on a basis of a location of a server module in a running state.

6. The server device according to claim 5, wherein:
   the switch module is connected to each of the server modules through a port determined in accordance with the location information; and
   the control unit is configured to control the operation status of the switch module so that a port connected to the server module in the running state is brought to a running state on the basis of the location information.

7. The server device according to claim 5, wherein the control unit is configured to newly decide the server module to become the target of the operation status control, on a basis of a connection relation between the server modules and the switch module.

8. A server control method executed by a server device having a plurality of server modules and a plurality of cooling fans in a chassis, the server control method comprising:
   executing control of the server modules and the cooling fans, the server modules and the cooling fans being able to be placed in predetermined positions, wherein:
   in the control, location information showing locations of the server modules and the cooling fans is referred to, and a server module and a cooling fan to become targets of operation status control are decided from among the server modules and the cooling fans, on a basis of the location information having been referred to; and
   in the control, in a case where there is a cooling fan in a running state, a server module located on an airflow caused by the cooling fan is decided as the server module to become the target of the operation status control.

9. A server device having a plurality of server modules and a plurality of cooling fans in a chassis, the server device comprising:
   a control unit configured to control the server modules and the cooling fans, the server modules and the cooling fans being able to be placed in predetermined positions, wherein:
   the control unit is configured to decide a server module and a cooling fan to become targets of operation status control from among the server modules and the cooling fans, on a basis of location information showing locations of the server modules and the cooling fans; and
   the control unit is configured to, in a case where there is a cooling fan in a running state, decide a server module to become the target of the operation status control on a basis of the cooling fan.

* * * * *